(12) United States Patent
He et al.

(10) Patent No.: US 9,091,270 B2
(45) Date of Patent: Jul. 28, 2015

(54) FAN ASSEMBLY

(75) Inventors: Yu-Wei He, Shenzhen (CN); Xiu-Quan Hu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 610 days.

(21) Appl. No.: 13/531,674

(22) Filed: Jun. 25, 2012

(65) Prior Publication Data
US 2013/0108436 A1    May 2, 2013

(30) Foreign Application Priority Data

Oct. 31, 2011    (CN) .......................... 2011 1 0337275

(51) Int. Cl.
| F04D 29/60 | (2006.01) |
| F04D 19/00 | (2006.01) |
| F04D 29/52 | (2006.01) |
| F04D 29/64 | (2006.01) |
| G06F 1/20 | (2006.01) |
| H05K 7/20 | (2006.01) |

(52) U.S. Cl.
CPC ............ *F04D 19/002* (2013.01); *F04D 29/526* (2013.01); *F04D 29/60* (2013.01); *F04D 29/646* (2013.01); *G06F 1/20* (2013.01); *H05K 7/20172* (2013.01)

(58) Field of Classification Search
CPC ..... F04D 19/002; F04D 25/08; F04D 29/526; F04D 29/60; F04D 29/64; F04D 29/646
See application file for complete search history.

(56) References Cited

U.S. PATENT DOCUMENTS

| 5,208,730 | A | * | 5/1993 | Tracy | 415/119 |
| 6,236,564 | B1 | * | 5/2001 | Fan | 415/213.1 |
| 6,373,698 | B1 | * | 4/2002 | Christensen | 361/695 |
| 6,493,225 | B2 | * | 12/2002 | Chuang et al. | 415/176 |
| 6,556,437 | B1 | * | 4/2003 | Hardin | 415/213.1 |
| 6,592,327 | B2 | * | 7/2003 | Chen et al. | 415/213.1 |
| 6,826,048 | B1 | * | 11/2004 | Dean et al. | 415/213.1 |
| 7,306,425 | B2 | * | 12/2007 | Park et al. | 415/214.1 |
| 7,522,415 | B2 | * | 4/2009 | Fan et al. | 415/213.1 |
| 7,688,585 | B2 | * | 3/2010 | Yin | 415/213.1 |
| 2004/0202541 | A1 | * | 10/2004 | Stewart et al. | 415/213.1 |
| 2013/0108431 | A1 | * | 5/2013 | He et al. | 415/208.1 |

FOREIGN PATENT DOCUMENTS

CN    103092293 A    * 10/2011    ............ F04D 29/60

* cited by examiner

*Primary Examiner* — Igor Kershteyn
(74) *Attorney, Agent, or Firm* — Novak Druce Connolly Bove + Quigg LLP

(57) ABSTRACT

A fan assembly includes a mounting bracket, a fan mounted on the mounting bracket and a fixing bracket. The fixing bracket includes two sidewalls mounted on two sides of the fan and a connecting wall mounted on a top of the fan. Two first protrusions are located on each side of the fan; two second protrusions adjacent to the two first protrusions are located on each side of the fan; two first slots are defined in each of the two sidewalls corresponding to the first protrusions; a plurality of second slots are defined in the connecting wall corresponding to the second protrusions; the first protrusions are engaged with the first slots; the second protrusions are engaged with the second slots; and one of the two sidewalls is mounted to the mounting bracket to fix the fan and the fixing bracket on the mounting bracket.

16 Claims, 6 Drawing Sheets

FAN ASSEMBLY

BACKGROUND

1. Technical Field

The present disclosure relates to a fan assembly for mounting a fan to an electronic device.

2. Description of Related Art

Fans are used to dissipate heat from a computer system. A chassis is provided for mounting the fan. A plurality of through holes are defined in the chassis. The fan defines a plurality of screw holes. The through holes of the chassis are aligned with the screw holes of the fan. A plurality of screws extends through the through holes to screw into the screw holes. The fan is thereby secured to the chassis of the computer system. However, the screw mounting means in assembly and disassembly of the fans is very labor-intensive and inconvenient.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
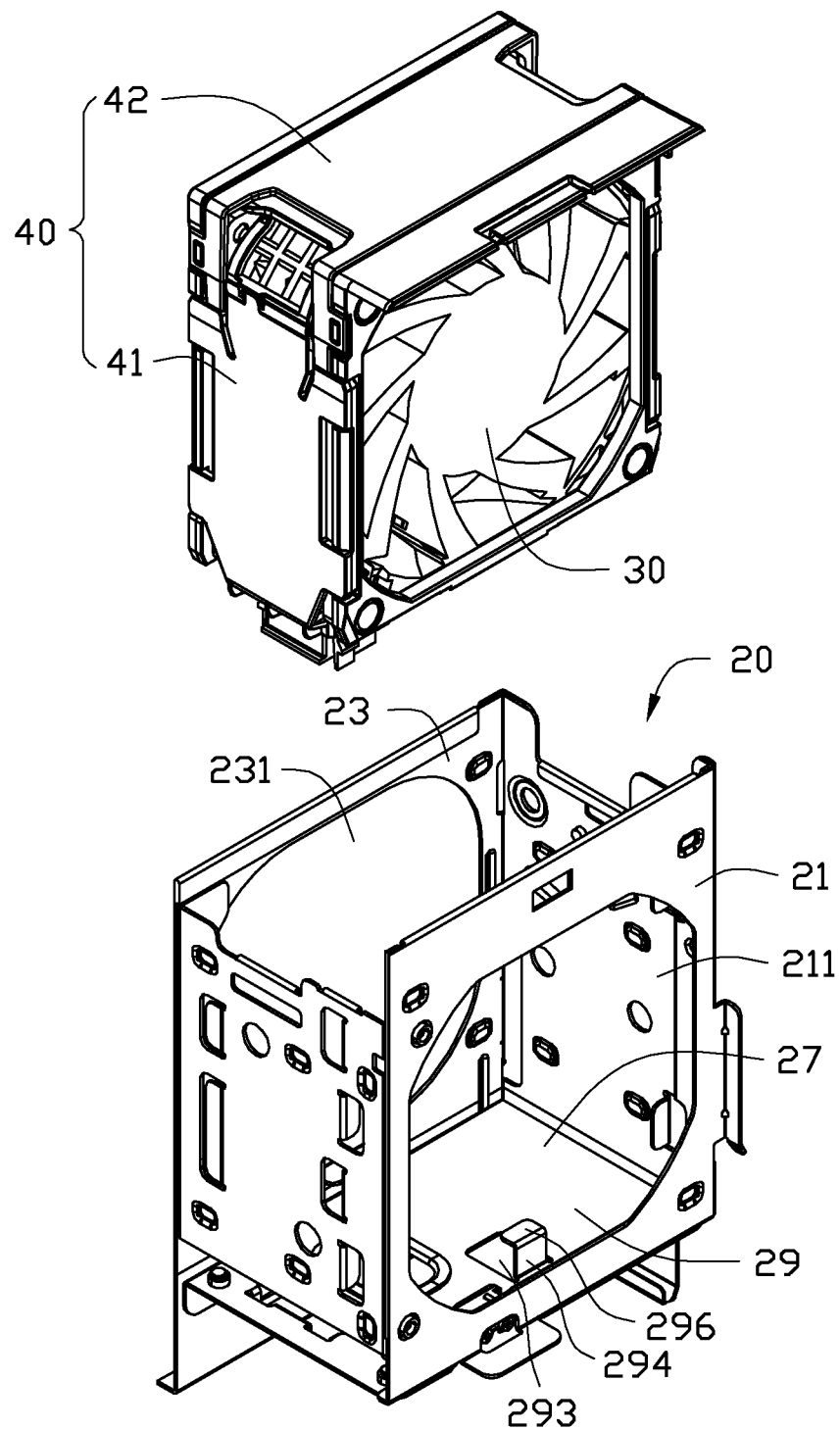
FIG. 1 is an exploded, isometric view of an embodiment of a fan assembly, the fan assembly including a mounting bracket, a fan and a fixing bracket.
Figure 2:
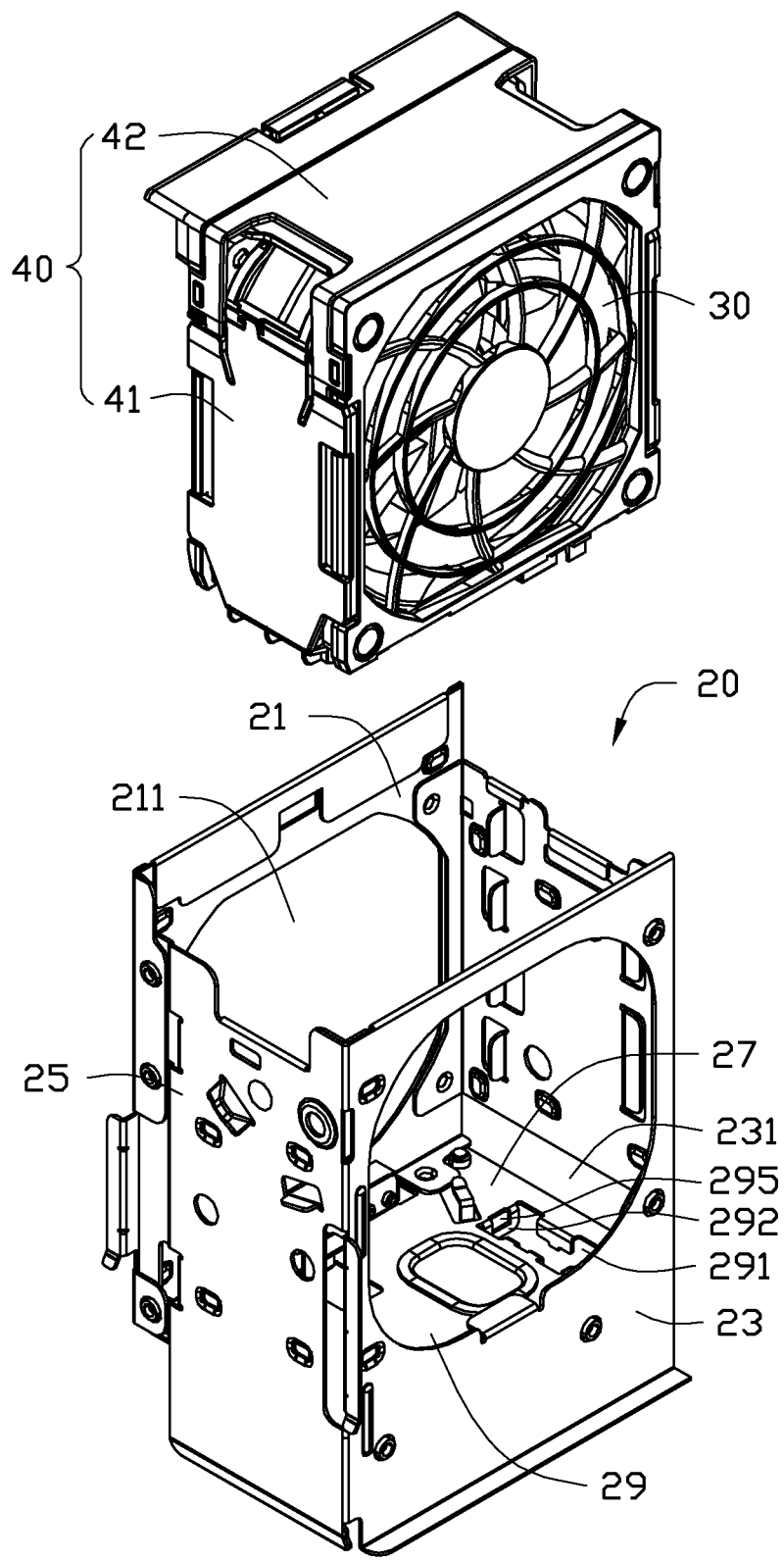
FIG. 2 is similar to FIG. 1, but viewed from another aspect.

Referring to FIGS. 1 and 2, a fan assembly in accordance with an embodiment includes a mounting bracket 20, a fan 30, and a fixing bracket 40.

The mounting bracket 20 includes a first clamp panel 21, a second clamp panel 23 parallel to the first clamp panel 21, two parallel clap panels 25 connected between the first clamp panel 21 and the second clamp panel 23, and a bottom panel 29 connected between the two clap panels 25. The first clamp panel 21, the second clamp panel 23, the two parallel clap panels 25, and the bottom panel 29 cooperatively form an accommodating room 27 therebetween. A first air passage opening 211 is defined in the first clamp panel 21. A second air passage opening 231 is defined in the second clamp panel 23 opposite to the first air passage opening 211. A first opening 291 and a second opening 293 are defined in the bottom panel 29. Two first fixing tabs 292 extend perpendicularly from two side edges of the first opening 291 downwardly. A third slot 295 is defined in each of the two first fixing tabs 292. A first connecting arm 294 upwardly extends perpendicular from a side edge of the second opening 293. A first supporting arm 296 extends horizontally from a side edge of the first connecting arm 294.

Figure 3:
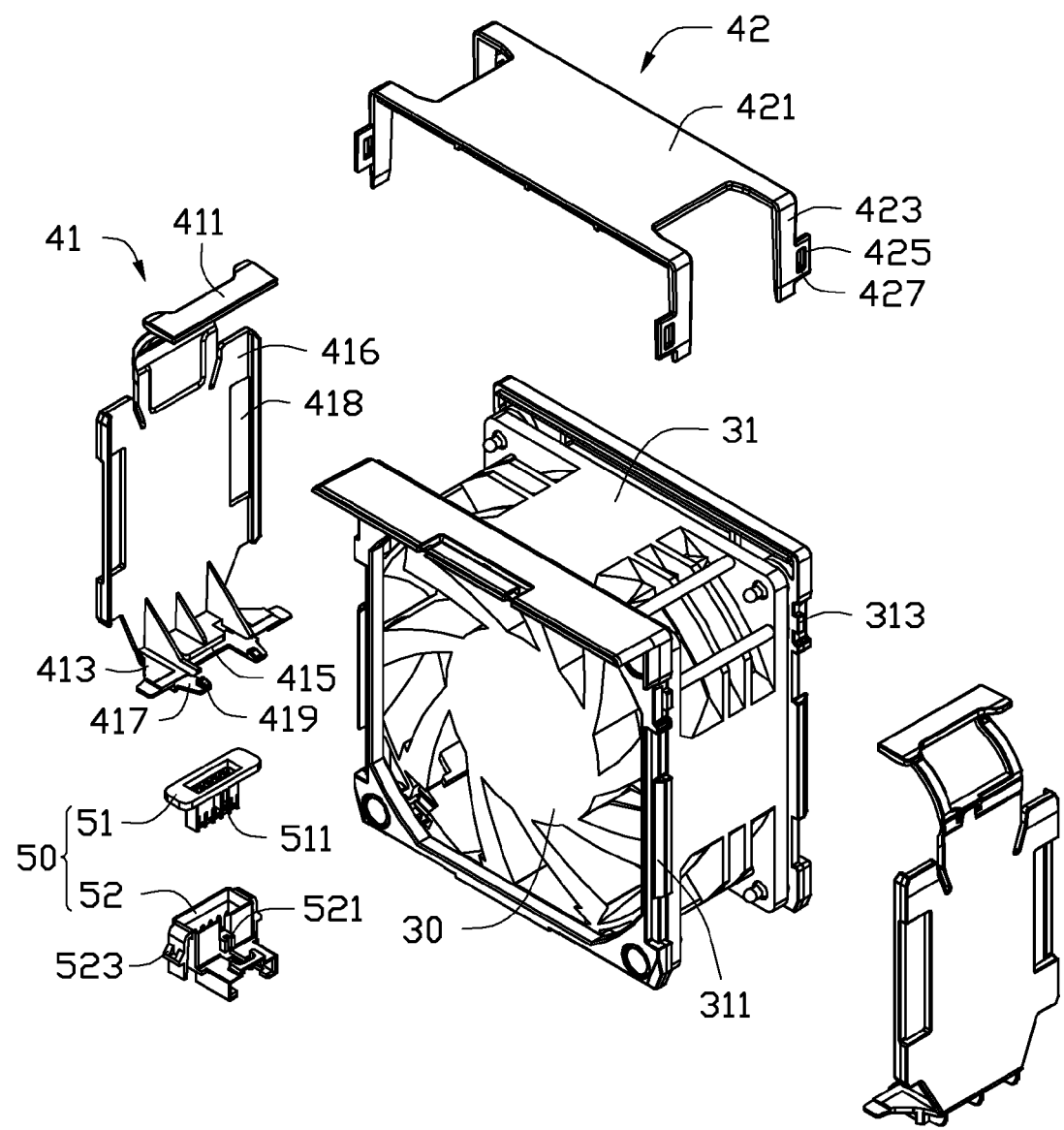
FIG. 3 is an exploded, isometric view of the fan and the fixing bracket of FIG. 1.
Figure 4:
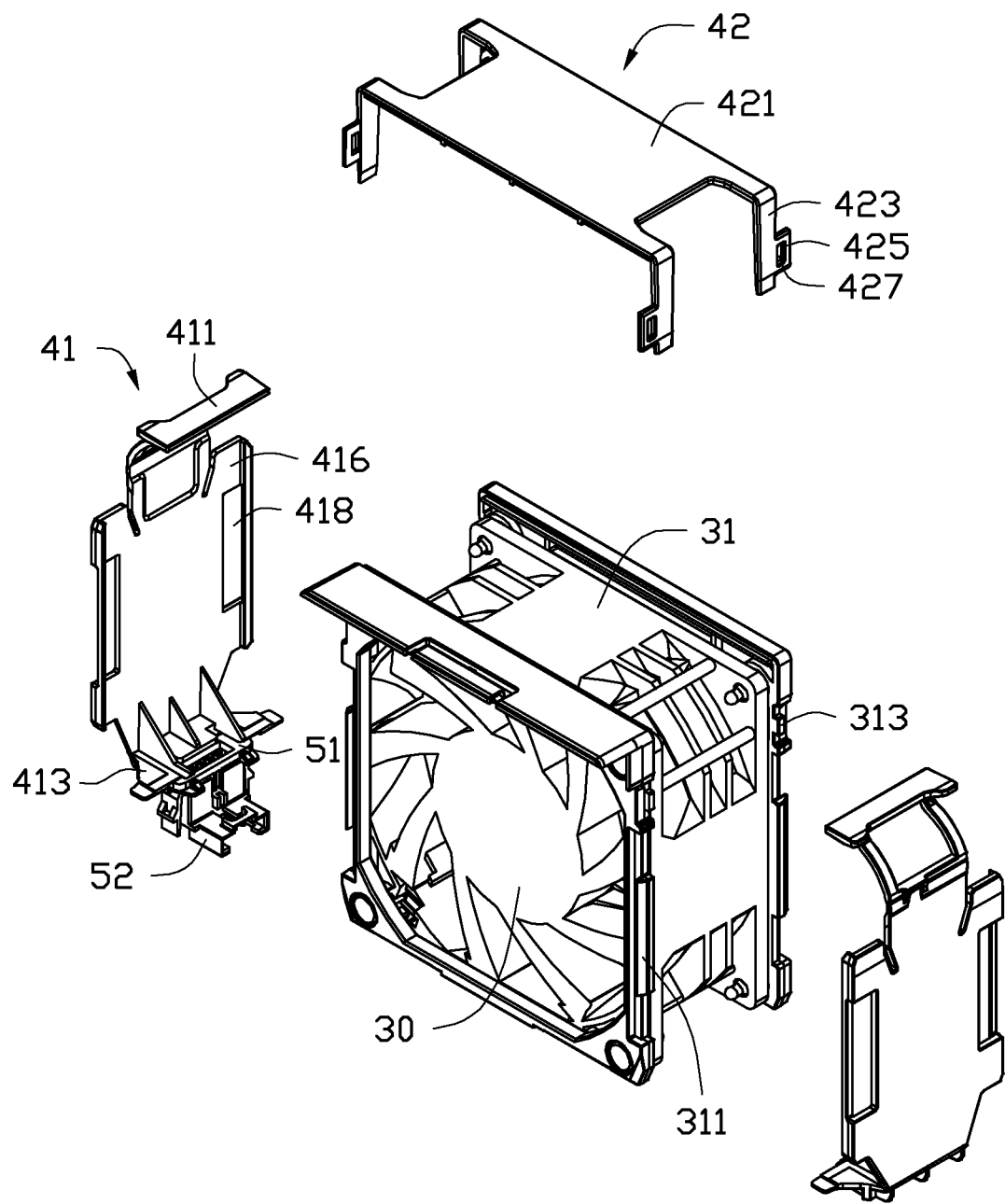
FIG. 4 is similar to FIG. 3, but viewed from another aspect.
Figure 5:
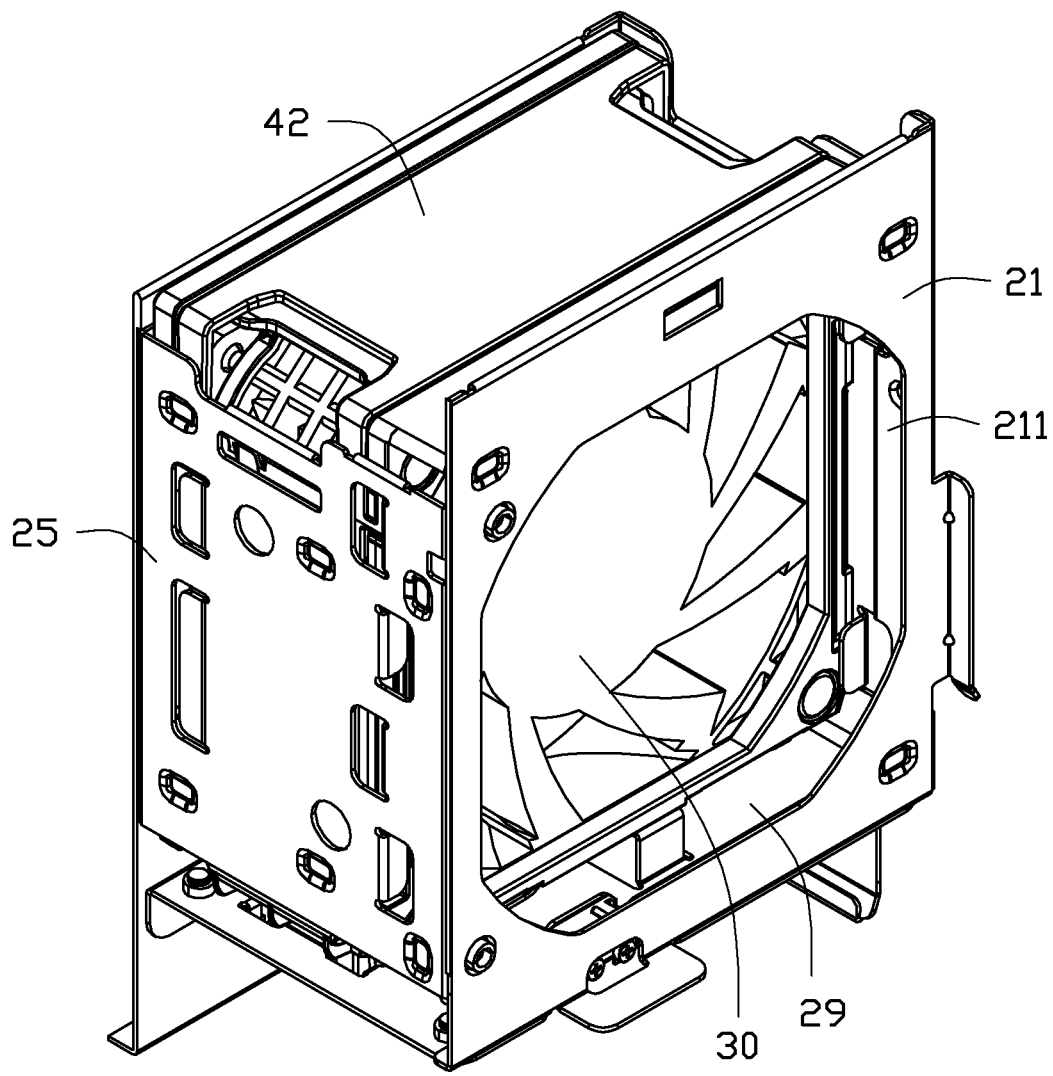
FIG. 5 is an assembled view of the fan assembly of FIG. 1.
Figure 6:
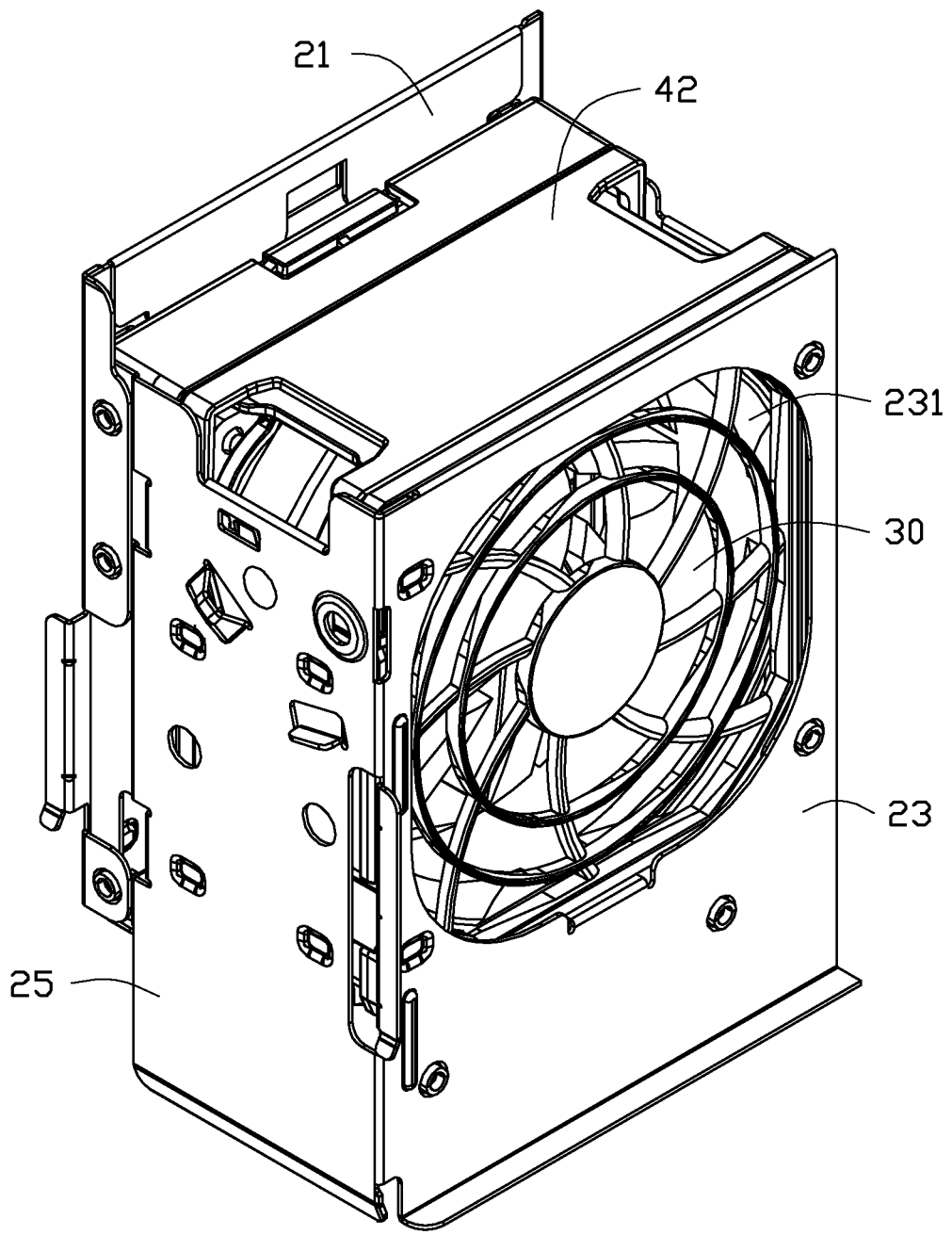
FIG. 6 is similar to FIG. 5, but viewed from another aspect.

Referring to FIGS. 3 and 4, the fan includes a housing 31 and a blade 32 enclosed by the housing 31. Two first protrusions 311 are located on each side of the housing 31. Two second protrusions 313 adjacent to the two first protrusions 311 are located on each side of the housing 31.

The fixing bracket 40 includes two sidewalls 41 and a connecting wall 42. A top wall 411 extends horizontally from a top portion of each of the two sidewalls 41. A first abutting wall 413 and a second abutting wall 415 extend horizontally from a bottom end of each of the two sidewalls 41. Two second fixing tabs 416 extend perpendicularly from two sides of each of the two sidewalls 41. A first slot 418 is defined in each of the second fixing tabs 416 corresponding to the first protrusion 311. Two hooks 417 extend perpendicularly from two sides of each of the second abutting walls 415. A trapezoid-shaped third protrusion 419 is located on each of the two hooks 417. The connecting wall 42 includes a second connecting arm 421 and four second supporting arms 423 extending perpendicularly from four corners of the second connecting arm 421 downwardly. A third fixing tab 425 extends perpendicularly from each of the second supporting arms 423. A second slot 427 is defined in each of the third fixing tabs 425 corresponding to the second protrusion 313.

The fan 30 and the fixing bracket 40 are fixed on the mounting bracket 20 by one of the two sidewalls 41 via a connector 50. The connector 50 includes a first connecting portion 51 and a second connecting portion 52 electrically connected to the first connecting portion 51. A fourth protrusion 511 is located on the first connecting portion 51. A fifth protrusion 521 is located on the second connecting portion 52. Two sixth protrusions 523 are located on two sides of the second connecting portion 52 corresponding to the two third slots 295.

Referring to FIGS. 1 to 6, in assembly, the four first protrusions 311 are engaged with the four first slots 418. The four second protrusions 313 are engaged with the four second slots 427. The top walls 411 of the two sidewalls 41 abut two side edges of the fan 30. The first connecting portion 51 is connected to the second connecting portion 52. The fourth protrusion 511 abuts the fifth protrusion 521. The two hooks 417 on one of the two second abutting walls 415 are inserted between the first connecting portion 51 and the second connecting portion 52. The third protrusions 419 on the corresponding hooks 417 abut a top portion of the first connecting portion 51. The second abutting wall 415 elastic deforms slightly. The hooks 417 are inserted in until the third protrusions 419 on the hooks 417 do not abut the top portion of the first connecting portion 51. The second abutting wall 415 elastically returns to a normal state. The top portion of the first connecting portion 51 is accommodated between the second abutting wall 415 and the corresponding first abutting wall 413 to abut an inner side of the third protrusions 419.

The fan 30 slides along the two parallel clap panels 25 and is received in the accommodating room 27. The two sixth protrusions 523 abut the two first fixing tabs 292. The two first fixing tabs 292 elastic deforms slightly. The fan 30 slides along the two parallel clap panels 25 until the two sixth protrusions 523 align with the two third slots 295 on the two first fixing tabs 292. The two first fixing tabs 292 elastic returns to a normal state. The two sixth protrusions 523 are engaged with the two third slots 295 to mount the fan on the mounting bracket 20. A bottom of the fan 30 is positioned on the first supporting arm 296. In use, the airflow from outside is sucked into the fan 30 via the second air passage opening 231. The airflow passes through the fan 30 and is blown out via the first air passage opening 211.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A fan assembly, comprising:
a mounting bracket comprising a first air passage opening and a second air passage opening opposite to the first air passage opening;
a fan mounted on the mounting bracket between the first air passage opening and the second air passage opening; and
a fixing bracket comprising two sidewalls mounted on two sides of the fan and a connecting wall mounted on a top of the fan;
wherein two first protrusions are located on each side of the fan; two second protrusions adjacent to the two first protrusions are located on each side of the fan; two first slots are defined in each of the two sidewalls corresponding to the two first protrusions; a plurality of second slots are defined in the connecting wall corresponding to the two second protrusions; the two first protrusions are engaged with the two first slots; the two second protrusions are engaged with the plurality of second slots; and one of the two sidewalls is mounted to the mounting bracket to fix the fan and the fixing bracket on the mounting bracket.

2. The fan assembly of claim 1, wherein a top wall extends horizontally from a top portion of each of the two sidewalls; a first abutting wall and a second abutting wall extend horizontally from a bottom end of each of the two sidewalls; the fan and the fixing bracket are fixed on the mounting bracket by one of the two sidewalls via a connector; the top wall abuts a side edge of the fan; and the connector is accommodated between the second abutting wall and the first abutting wall of the one of the two sidewalls.

3. The fan assembly of claim 2, wherein two hooks extend perpendicularly from two sides of the second abutting wall; a trapezoid-shaped third protrusion is located on each of the two hooks; and the connector abuts an inner side of each of the third protrusion.

4. The fan assembly of claim 3, wherein the connector comprises a first connecting portion and a second connecting portion electrically connected to the first connecting portion; a fourth protrusion is located on the first connecting portion; a fifth protrusion is located on the second connecting portion; the fourth protrusion abuts the fifth protrusion; and a top portion of the first connecting portion is accommodated between the second abutting wall and the first abutting wall of the one of the two sidewalls to abut an inner side of each of the third protrusion.

5. The fan assembly of claim 4, wherein two sixth protrusions are located on two sides of the second connecting portion; a first opening is defined in the mounting bracket; two first fixing tabs extend perpendicularly from two side edges of the first opening downwardly; a third slot is defined in each of the two first fixing tabs corresponding to each of the two sixth protrusions; and each of the two sixth protrusions is engaged with the third slot to mounted the second connecting portion on the mounting bracket.

6. The fan assembly of claim 5, wherein a second opening is defined in the mounting bracket; a first connecting arm extends perpendicularly from a side edge of the second opening upwardly; a first supporting arm extends horizontally from a side edge of the first connecting arm; and a bottom of the fan is positioned on the first supporting arm.

7. The fan assembly of claim 1, wherein two second fixing tabs extend perpendicularly from two sides of each of the two sidewalls; and each of the two first slots is defined in each of the two second fixing tabs.

8. The fan assembly of claim 1, wherein the connecting wall comprises a second connecting arm and four second supporting arms extending perpendicularly from four corners of the second connecting arm downwardly; a third fixing tab extends perpendicularly from each of the four second supporting arms; and one of the plurality of second slots is defined in each of the third fixing tab.

9. A fan assembly, comprising:
a mounting bracket comprising a first air passage opening and a second air passage opening opposite to the first air passage opening;
a fan mounted on the mounting bracket between the first air passage opening and the second air passage opening; and
a fixing bracket comprising two sidewalls mounted on two sides of the fan and a connecting wall mounted on a top of the fan; wherein two first protrusions are located on each side of the fan; two second protrusions adjacent to the two first protrusions are located on each side of the fan; two first slots are defined in each of the two sidewalls corresponding to the two first protrusions; a plurality of second slots are defined in the connecting wall corresponding to the two second protrusions; each of the first two protrusions is engaged with each of the two first slots; each of the two second protrusions is engaged with each of the plurality of second slots; and one of the two sidewalls is mounted to the mounting bracket via a connector to fix the fan and the fixing bracket on the mounting bracket.

10. The fan assembly of claim 9, wherein a top wall extends horizontally from a top portion of each of the two sidewalls; a first abutting wall and a second abutting wall extend horizontally from a bottom end of each of the two sidewalls; the two top walls of the two sidewalls abut two side edges of the fan; and the connector is accommodated between the second abutting wall and the first abutting wall of the one of the two sidewalls.

11. The fan assembly of claim 10, wherein two hooks extend perpendicularly from two sides of the second abutting wall; a trapezoid-shaped third protrusion is located on each of the two hooks; and the connector abuts an inner side of each of the third protrusion.

12. The fan assembly of claim 11, wherein the connector comprises a first connecting portion and a second connecting portion electrically connected to the first connecting portion; a fourth protrusion is located on the first connecting portion; a fifth protrusion is located on the second connecting portion; the fourth protrusion abuts the fifth protrusion; and a top portion of the first connecting portion is accommodated between the second abutting wall and the first abutting wall of one of the two sidewalls to abut an inner side of each of the third protrusion.

13. The fan assembly of claim 12, wherein two sixth protrusions are located on two sides of the second connecting portion; a first opening is defined in the mounting bracket; two first fixing tabs extend perpendicularly from two side edges of the first opening downwardly; a third slot is defined in each of the two first fixing tabs corresponding to each of the two sixth protrusions; and each of the two sixth protrusions is engaged with each of the two third slots to mounted the second connecting portion on the mounting bracket.

14. The fan assembly of claim 13, wherein a second opening is defined in the mounting bracket; a first connecting arm extends perpendicularly from a side edge of the second opening upwardly; a first supporting arm extends horizontally from a side edge of the first connecting arm; and a bottom of the fan is positioned on the first supporting arm.

15. The fan assembly of claim 9, wherein each of two second fixing tabs extends perpendicularly from two sides of each of the two sidewalls; and each of the two first slots is defined in each of the two second fixing tabs.

16. The fan assembly of claim 9, wherein the connecting wall comprises a second connecting arm and four second supporting arms extending perpendicularly from four corners of the second connecting arm downwardly; a third fixing tab extends perpendicularly from each of the four second supporting arms; and one the plurality of second slots is defined in each of the third fixing tab.

\* \* \* \* \*